(12) United States Patent
Joshi et al.

(10) Patent No.: US 7,746,709 B2
(45) Date of Patent: *Jun. 29, 2010

(54) MEMORY CIRCUIT WITH DECOUPLED READ AND WRITE BIT LINES AND IMPROVED WRITE STABILITY

(75) Inventors: Rajiv V. Joshi, Yorktown Heights, NY (US); Jae-Joon Kim, Yorktown Heights, NY (US); Rahul M. Rao, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/329,133

(22) Filed: Dec. 5, 2008

(65) Prior Publication Data
US 2009/0147592 A1    Jun. 11, 2009

Related U.S. Application Data

(63) Continuation of application No. 11/668,545, filed on Jan. 30, 2007, now Pat. No. 7,495,969.

(51) Int. Cl.
*G11C 7/00* (2006.01)
(52) U.S. Cl. .......................... 365/189.05; 365/189.14; 365/194
(58) Field of Classification Search ............ 365/189.05, 365/194, 189.14
See application file for complete search history.

(56) References Cited

U.S. PATENT DOCUMENTS

| | | | |
|---|---|---|---|
| 6,279,144 B1 | 8/2001 | Henkels et al. | |
| 7,075,811 B2 * | 7/2006 | Iwanari | 365/145 |
| 7,087,942 B2 * | 8/2006 | Osada et al. | 257/204 |
| 7,495,969 B2 * | 2/2009 | Joshi et al. | 365/189.05 |

OTHER PUBLICATIONS

LeLand Chang et al., "Stable SRAM Cell Design for the 32 nm Node and Beyond"; 2005 VLSI Technology Symposium.

* cited by examiner

*Primary Examiner*—Son Dinh
(74) *Attorney, Agent, or Firm*—Ryan, Mason & Lewis, LLP

(57) ABSTRACT

In a memory circuit, data from all cells along a selected word line is read. Then, the read data is written back to half-selected cells and new data is written to the selected cells in the next cycle. In cases where a READ bit line (RBL) and WRITE bit line (WBL) are decoupled, RBL and WBL can be accessed simultaneously. Hence, the WRITE in the n-th cycle can be delayed to the n+1-th cycle as far as there is no data hazard such as reading data from memory before correct data are actually written to memory. As a result, there is no bandwidth loss, although the latency of the WRITE operation increases. WRITE stability issues in previous configurations with decoupled RBL and WBL are thus addressed.

12 Claims, 11 Drawing Sheets

Q="0", WBLb="0" (SAME)
Qb="1", WBL="VDD"

SOLUTION TO AVOID READ-BEFORE-WRITE HAZARD

CONDITIONAL WB MUX: SCHEME 1

CONDITIONAL WB MUX: SCHEME 2

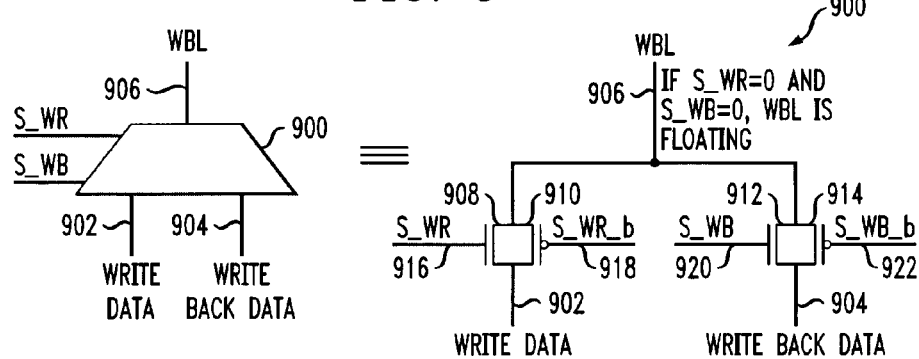

S_WB=$\overline{\text{CS[n-1]}}$ · $\overline{\text{CONSEC}}$          *S_WR AND S_WB ARE GENERATED IN 719.

IF $\overline{\text{CS[n-1]}}$ · $\overline{\text{CONSEC}}$ = 1, WBL BECOMES FLOATING TO BLOCK BOTH WR AND WB.

X_b = COMPLEMENTARY SIGNAL OF X
CS[n-1] AND CONSEC FROM CIRCUIT OF FIG. 16

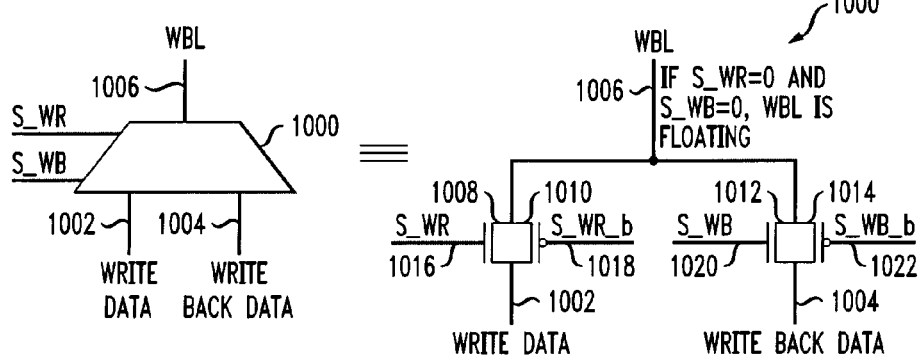

S_WB=$\overline{\text{CS[n-1]}}$ · ($\overline{\text{CS[n-2]}}$ + $\overline{\text{CONSEC}}$)

IF $\overline{\text{CS[n-1]}}$ · CS[n-2] · $\overline{\text{CONSEC}}$ = 1, WBL SHOULD BE FLOATING TO BLOCK BOTH WR AND WB.

CS[n-1], CS[n-2] AND CONSEC FROM CIRCUIT OF FIG. 16

CONDITIONAL MULTIPLE WB/WR MUX

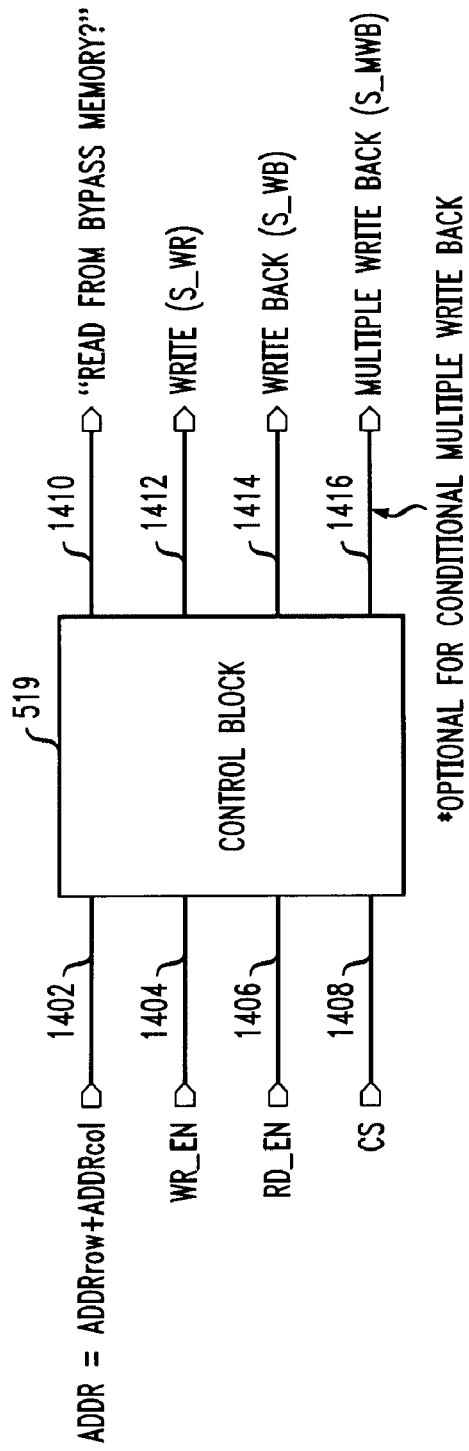

FIG. 14

ADDR = ADDRESS FOR CELL, WHERE ADDRrow=ADDRESS FOR ROW, ADDRcol=ADDRESS FOR COLUMN
WR_EN = WRITE ENABLE, RD_EN = READ ENABLE
CS = COLUMN SELECT SIGNAL DECODED FROM ADDRcol
"READ FROM BYPASS MEMORY?" = 1 WHEN WE NEED TO READ FROM BYPASS MEMORY
S_WR: PASS THE WRITE DATA WHEN S_WR=1
S_WB: PASS THE READ DATA FROM CELL FOR WRITE BACK WHEN S_WB=1
S_MWB: PASS THE TWO-CYCLE DELAYED WRITE DATA WHEN S_MWB=1

FIG. 15
GENERATION OF "READ FROM BYPASS MEMORY?" SIGNAL
"READ FROM BYPASS MEMORY?" = WR_EN[n−1] · RD_EN[n] · (ADDR[n−1]=ADDR[n])
→ WHEN WRITE IS FOLLOWED BY READ FOR THE SAME CELL
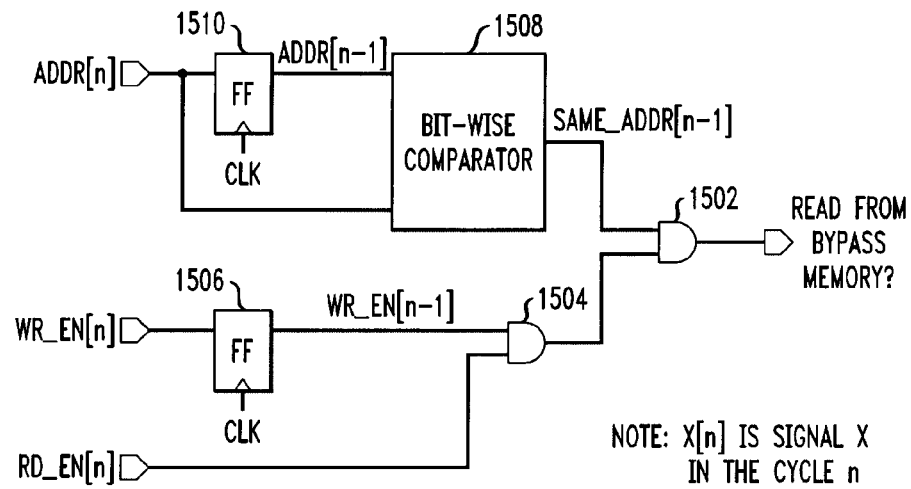
NOTE: X[n] IS SIGNAL X IN THE CYCLE n
FIG. 16
GENERATION OF CS AND CONSEC
CS=COLUMN SELECT SIGNAL
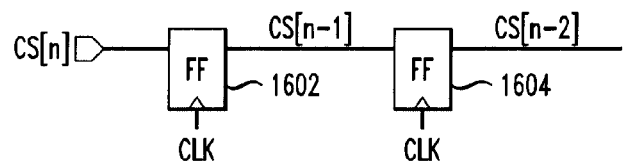
CONSEC=WR_EN[n−2] · (ADDRrow[n−2]=ADDRrow[n−1]))
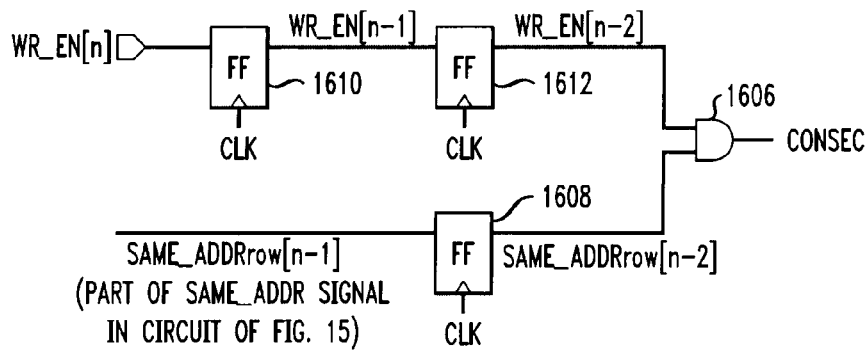

MEMORY CIRCUIT WITH DECOUPLED READ AND WRITE BIT LINES AND IMPROVED WRITE STABILITY

CROSS-REFERENCE TO RELATED APPLICATIONS

This application is a continuation, under 37 CFR 1.53(b), of co-assigned U.S. patent application Ser. No. 11/668,545, now U.S. Pat. No. 7,495,969, of inventors Joshi et al., and claims the benefit thereof, said application Ser. No. 11/668,545 having been filed on Jan. 30, 2007, and entitled "Techniques For Improving Write Stability of Memory With Decoupled Read and Write Bit Lines." The complete disclosure of the aforesaid application Ser. No. 11/668,545, now U.S. Pat. No. 7,495,969, is expressly incorporated herein by reference in its entirety for all purposes.

FIELD OF THE INVENTION

The present invention generally relates to electronic circuits and, more particularly, to electronic memory circuits.

BACKGROUND OF THE INVENTION

As device size shrinks down aggressively in advanced very large scale integration (VLSI) technology, increased process variation causes significant amounts of threshold voltage fluctuation. As a result, stability of static random access memory (SRAM) deteriorates due to the large threshold voltage mismatch between two neighboring transistors in a cell. The conventional 6-transistor (6T) SRAM 100, depicted in FIG. 1, includes a first inverter formed by p-type and n-type field effect transistors (PFET and NFET, respectively) PL and NL (numbered 102 and 104), cross-coupled to a second inverter formed by PFET PR and NFET NR, numbered 106, 108. The cross-coupled inverters are connected to a voltage supply node 110 and a ground 112. Left and right NFET access devices AL, AR, numbered 114 and 116, interconnect true bit line 118 and complementary bit line 120 to storage nodes Qb (numbered as 126) and Q (numbered as 124), respectively, under control of word line 122.

Cell 100 has its worst stability during the READ mode because the voltage at the storage node which has a "0" logic value (node Q numbered as 124, in FIG. 1) goes up during the READ cycle. If the increased node voltage is larger than the trip voltage of the inverter formed by the PL-NL pair (FETs 102 and 104), the stored logic values will be flipped and data will be lost.

Turning now to FIG. 2, a memory cell 200 with decoupled READ and WRITE bit lines (that is, a single-end READ eight transistor (8T) SRAM cell) has been proposed to make the memory cell stable in READ mode. See L. Chang et. al, "Stable SRAM Cell Design for the 32 nm Node and Beyond," VLSI technology symp. 2005. Another pertinent prior art application is set forth in U.S. Pat. No. 6,279,144 to Henkels et al., entitled "Provably Correct Storage Arrays." With continued reference to FIG. 2, note that elements therein similar to those in FIG. 1 have received the same reference character incremented by one hundred and will not be described again except to the extent that they differ substantially from the corresponding elements in FIG. 1. True and complementary WRITE bit lines 218, 220 are provided as before and access devices 214, 216 selectively connect the inverters to them under the control of WRITE word line 222. However, a separate READ word line 228 is provided, and node 224 is connected to the gate of one of two series read access devices, for example, NFETS 232, 234, with the gate of the other series FET connected to READ word line 228. When a high logic level is present on READ word line 228 and node 224, both NFETS 232 and 234 turn on to connect READ bit line 230 to ground node 236.

Although the memory cell 200 with decoupled READ and WRITE is stable in the READ mode, it is still unstable in a "Half-Select" condition during the WRITE mode, if cells are interleaved along a word line (interleaving is discussed below).

It would be desirable to overcome the limitations in previous approaches.

SUMMARY OF THE INVENTION

Principles of the present invention provide techniques for improving WRITE stability in memories with decoupled READ and WRITE bit lines. In one aspect, an exemplary memory circuit includes a plurality of cells that form rows and columns. The circuit further includes a retained data latch, a latch for new data (also referred to herein as a new data latch), and control circuitry operatively coupled to the cells, the retained data latch, and the new data latch. The control circuitry is configured to write data during a WRITE operation. In a first cycle, data associated with all cells in a given one of the rows that is to be written to is read into the retained data latch, and new data to delay the WRITE operation for a cycle is stored into the new data latch. In an immediately subsequent second cycle, the read data from the retained data latch is written back to those of the cells that are in a half-select condition, and the new data from the new data latch is written to those of the cells that are in a full-select condition.

In another aspect, an exemplary method of writing data during a WRITE operation in a memory with features similar to the kind just described includes the steps of, in a first cycle, reading, into the retained data latch, data associated with all cells in a given one of the rows that is to be written to, and storing, into the new data latch, new data to delay the WRITE operation for a cycle. Further, the method includes the steps of, in an immediately subsequent second cycle, writing the read data from the retained data latch back to those of the cells that are in a half-select condition, and writing the new data from the new data latch to those of the cells that are in a full-select condition.

One or more embodiments of the present invention may be realized in the form of an integrated circuit.

These and other objects, features and advantages of the present invention will become apparent from the following detailed description of illustrative embodiments thereof, which is to be read in connection with the accompanying drawings.

BRIEF DESCRIPTION OF THE DRAWINGS

FIGS. 7-12 show exemplary circuitry for handling a WRITE-after-WRITE data hazard, via a conditional WRITE-back scheme, according to an aspect of the invention;

FIG. 14 shows a top level description of an exemplary control block;

FIG. 15 shows a first exemplary implementation of the block of FIG. 14; and

FIG. 16 shows a second exemplary implementation of the block of FIG. 14.

DETAILED DESCRIPTION OF PREFERRED EMBODIMENTS

Figure 1:
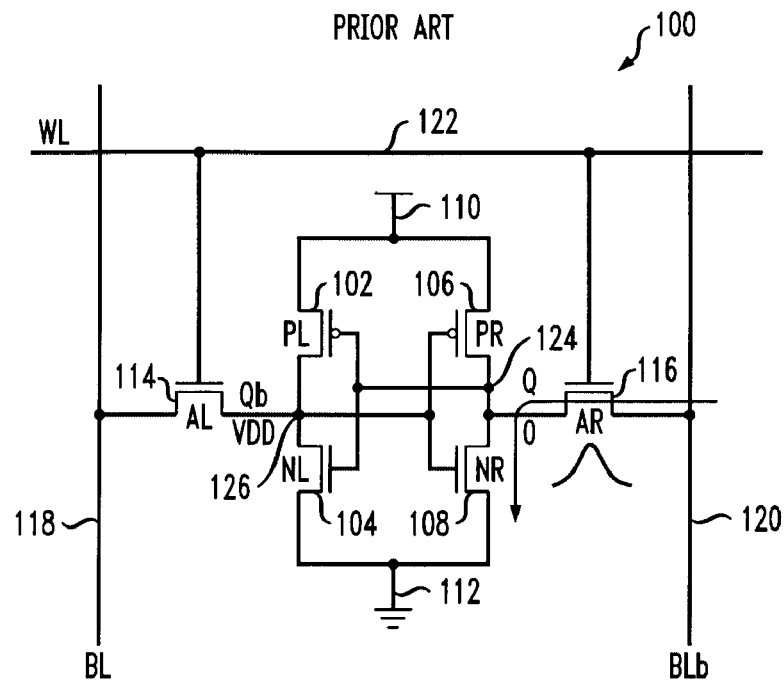
FIG. 1 shows a prior-art 6T SRAM cell.
Figure 2:
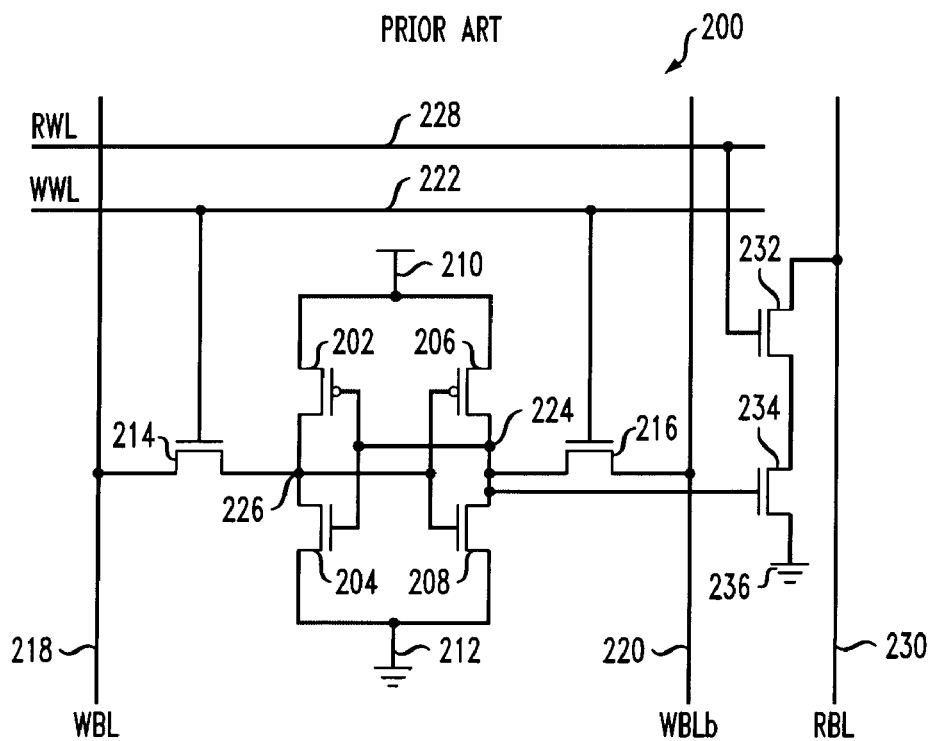
FIG. 2 shows a prior-art 8T SRAM cell.
Figure 3:
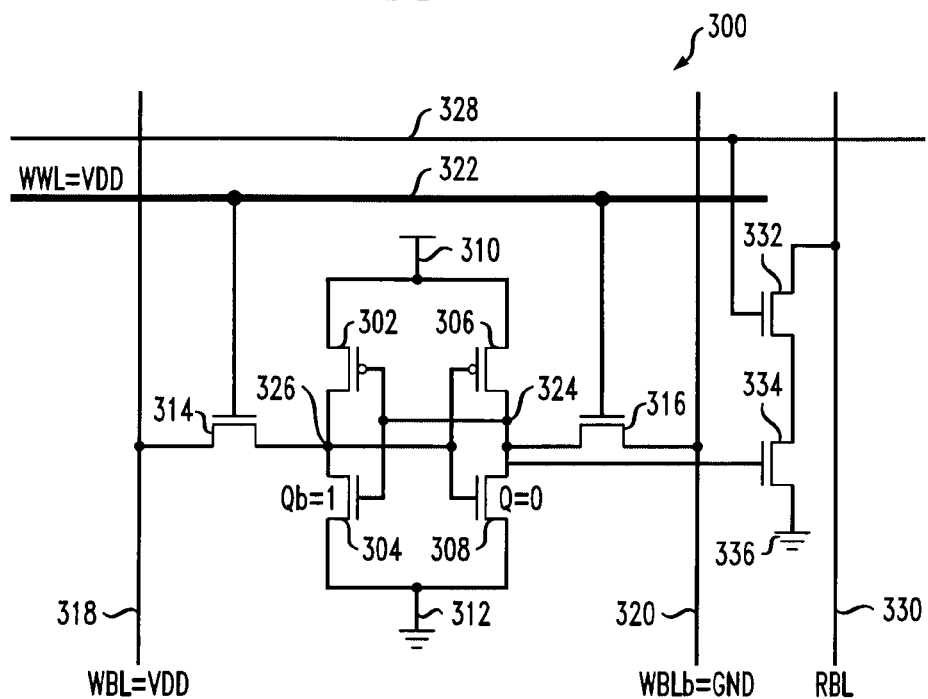
FIG. 3 shows an inventive 8T SRAM cell.

FIG. 3 shows an inventive memory cell 300. Elements in FIG. 3 similar to those in FIG. 2 have received the same reference character incremented by one hundred and will not be described again except to the extent that they differ substantially from the corresponding elements in FIG. 2. In the prior-art cell 200 of FIG. 2, during a half-select condition, when the WRITE word line 222 is raised to a high logic level (VDD), in the case when node Q stores a zero and node Qb stores a one, the true WRITE bit line 218 is at VDD, that is, the same potential as node Qb, so no current is anticipated through transistor 214. However, the complementary WRITE bit line 220 is at VDD while node Q is at a zero logic level, so noise current is anticipated through transistor 216. In the exemplary inventive cell 300, the true and complementary WRITE bit lines 318, 320 are pre-conditioned to the same voltage as the storage node voltage, to avoid a "pseudo-READ" in the half select condition. This can be accomplished by breaking the WRITE operation up into two operations over two consecutive cycles; first, the cell 300 is read, and then the data is written back in the next cycle to the true and complementary WRITE bit lines 318, 320. It should be noted that while a specific exemplary cell is depicted in FIG. 3, inventive circuits and techniques are generally applicable to memories with decoupled READ and WRITE bit lines, using any appropriate kinds of cells.

Figure 4:
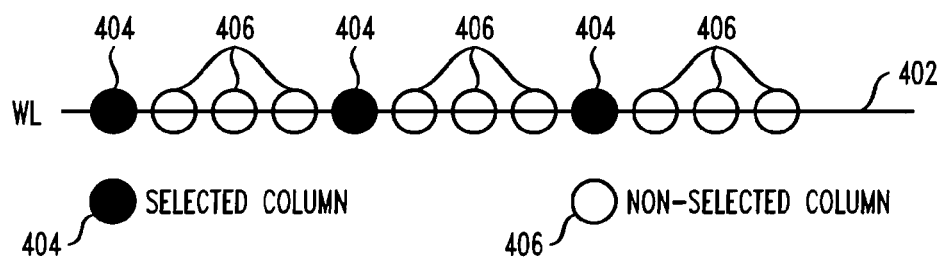
FIG. 4 shows column-interleaving.

With attention now to FIG. 4, one or more inventive circuits or methods may be especially useful in cases where an interleaved cell structure is employed. A word line 402 is associated with a number of selected columns 404 and a number of non-selected columns 406. Column-select techniques in interleaved cell structures are popular, for example, in on-chip cache design since they enable simpler word line designs and prevent multiple-bit soft errors. However, as noted, prior art cells, such as that depicted in FIG. 2, are unstable in the half-select condition during WRITE mode, where the cells are interleaved along a word line. The bit lines structures, word line structures, and cells discussed above can form a column-interleaved memory array under control of control circuitry, to be discussed below.

Figure 5:
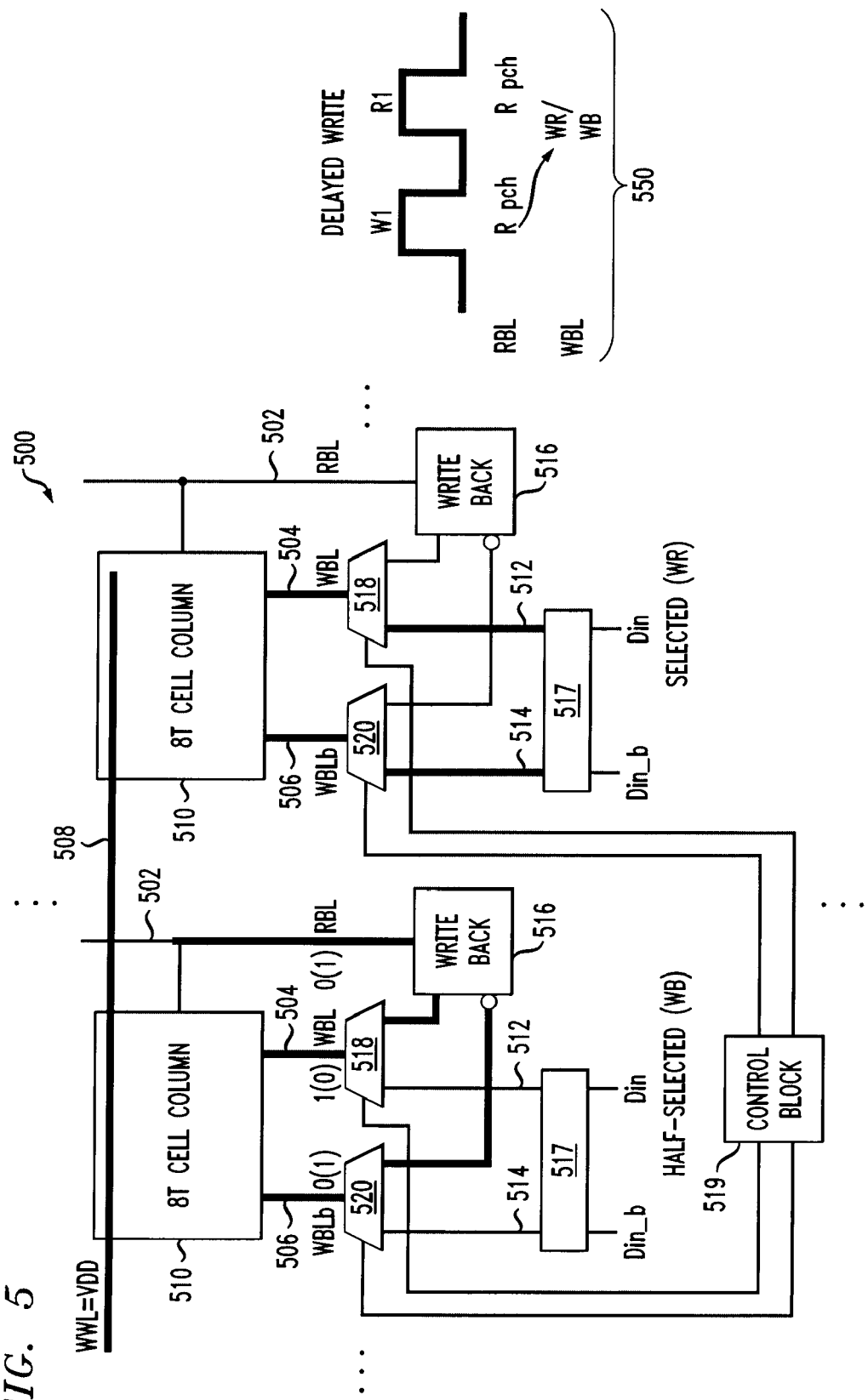
FIG. 5 shows an exemplary embodiment of the invention (FIGS. 5-13 also serve to illustrate exemplary inventive method steps)

FIG. 5 depicts an exemplary embodiment of an inventive memory circuit 500 comprising a plurality of bit line structures including decoupled READ and WRITE bit lines 502 (READ) and 504, 506 (true and complementary WRITE bit lines), and a plurality of word line structures, including at least WRITE word lines 508 (only a single WRITE word line 508 is shown for illustrative convenience). The word line structures intersect the plurality of bit line structures at a plurality of cell locations. A plurality of cells, such as, by way of example and not limitation, cells such as cell 300, are present at the cell locations. The cells form rows associated with given ones of the word line structures 508 and columns 510 associated with given ones of the bit line structures. Only two columns 510 are depicted, for purposes of illustrative convenience, but it is to be understood that many columns 510 can be provided, and there can be many bit line structures, many word line structures, many rows, and many cells in each column 510, as indicated by the ellipses.

Circuit 500 also includes a retained data latch 516, a latch for new data (also referred to herein as a new data latch) 517, and control circuitry including control block 519 operatively coupled to the cells, the retained data latch 516, and the new data latch 517. It will be appreciated that one latch 517 should be provided for each column, but we need only one set of such latches. In other words, if we have m sub-arrays with n columns for each sub-array, we need n latches. Note that as used herein, including the claims, "control circuitry" is intended to include, by way of example and not limitation, hardware, or software or firmware running on hardware, that causes the indicated operations to occur; for example, a control block 519 operatively coupled to appropriate elements such as the various multiplexers discussed herein. A detailed exemplary implementation of block 519 is set forth below. Note that as used herein, including the claims, "operatively coupled" is defined as meaning the given elements are electrically interconnected either directly or indirectly through other elements, devices or components so as to provide functionality for a given operation, for example, reading or writing data. The control circuitry is configured to cause writing of data during a WRITE operation, according to inventive techniques. Note that each column is coupled to true 512 and complementary 514 data inputs, and that the true and complementary WRITE bit lines are each coupled to multiplexers 518, 520 respectively. The left-most column is in a half-select condition, while the right-most column is in a full-select condition. Memory 500 can be, for example, a column-interleaved memory array with decoupled READ and WRITE bit lines Inventive techniques enhance the stability of memory with decoupled READ and WRITE bit lines, in the "Half-Select" WRITE mode (first column in FIG. 5). We assume, for illustrative purposes, the following conditions:

1. Memory cell data is stable during and after the READ cycle.
2. Memory cell data is very unstable in the "Half-Select" WRITE mode (to be addressed via inventive techniques).

With reference to timing diagram 550 of FIG. 5, inventive techniques allow for one-cycle delayed WRITE using a READ-MODIFY-WRITE approach. For a WRITE operation in the inventive scheme, we first read the data from all cells along the selected word line 508. Since the READ operation is stable, there is no data loss after READ. Then, we write back the read data to half-selected cells (left-hand column) and write new data to the selected cells (right-hand column) in the next cycle. There is no data loss in half-selected cells using inventive techniques, since bit lines 504, 506 of half-selected cells are pre-conditioned to correct data via WRITE-BACK. The inventive delayed WRITE with READ/MODIFY/WRITE scheme prevents data loss in the half-selected cells (left-hand column) during WRITE mode.

Since the READ bit line 502 (RBL) and WRITE bit lines 504, 506 (WBL) are decoupled, RBL and WBL can be accessed simultaneously. Hence, a WRITE in the n-th cycle can be delayed to the n+1-th cycle as far as there is no data hazard such as reading data from memory before correct data are actually written to memory. As a result, there is no bandwidth loss, although the latency of the WRITE operation increases with the proposed delayed WRITE (Read-Modify-Write). Techniques to address data hazards are presented below; in particular, an inventive bypass memory can solve the READ-AFTER-WRITE hazard and a conditional WRITE-BACK scheme can solve the WRITE-AFTER-WRITE hazard.

For the WRITE operation, data can be read from all cells first. Since the READ is stable, there is no data loss after READ. Then, one can write back the read data to half-selected cells (left-hand column) and write new data (delayed one cycle in new data latch 517) to the selected cells (right-hand column) in the next cycle. There is no data loss in half-selected cells, since the bit lines are pre-conditioned to correct data via WRITE-BACK.

Thus, control circuitry, including block 519, can cause the following to occur: in a first cycle, data associated with all cells in a given one of the rows that is to be written to is read into the retained data latch 516, and new data, to delay the WRITE operation for a cycle, is stored into the new data latch 517. In an immediately subsequent second cycle, the read data from the retained data latch 516 is written back to those of the cells that are in a half-select condition (left column), while the new data from the new data latch 517 is written to those of the cells that are in a full-select condition (right column). This can be accomplished via multiplexers 518, 520. In particular, multiplexers 518, 520 for left-most column 510, in the half-select condition, are selected to take the data to be written from retained data latch 516, while multiplexers 518, 520 for right-most column 510 (full select) are set to take the data from data lines 512, 514. Latch 516 is connected to READ bit line 502 to obtain the data read in the READ part of the two-step WRITE process.

READ-After-WRITE Data Hazard

Figure 6:
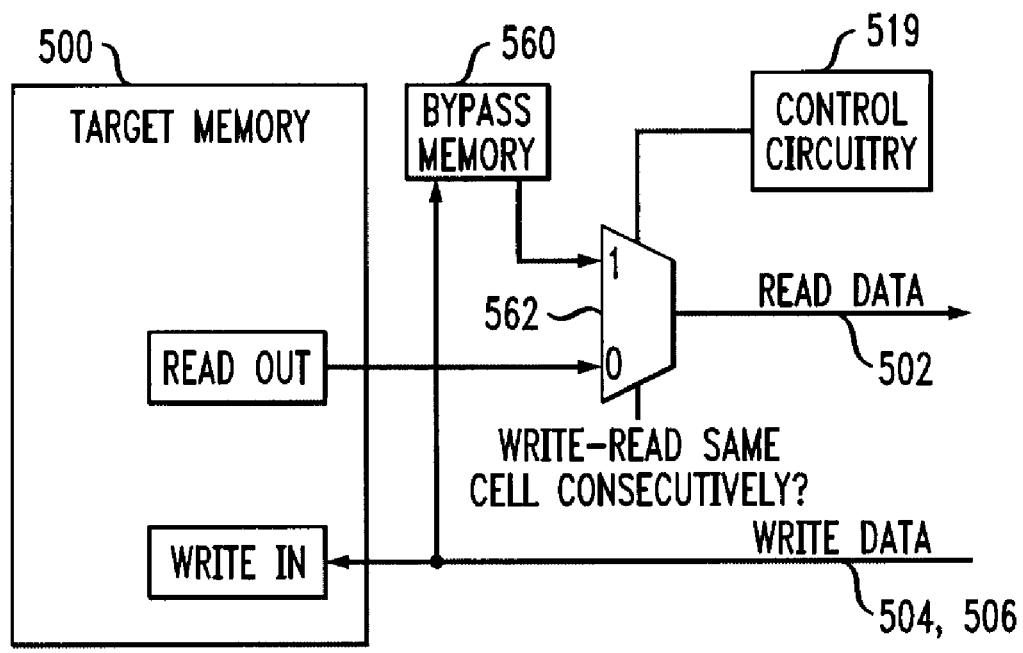
FIG. 6 shows exemplary circuitry for handling a READ-after-WRITE data hazard according to an aspect of the invention.

In the exemplary inventive scheme, newly written data cannot be read if back-to-back WRITE-READ operations occur for the same cells, since the delayed WRITE operation will not be finished before the READ starts. With reference to FIG. 6, which shows possible additional components for memory 500 to address the subject data hazard, a bypass memory 560 is employed in conjunction with an additional multiplexer 562 to avoid the hazard. In WRITE mode, the data is written to both the target memory 500 and bypass memory 560. The bypass memory must be fast enough for data to be written within a cycle. In the consecutive WRITE-READ (for the same cell) case, the data is read from the bypass memory 560 instead of from target memory 500, using multiplexer 562 under control of the control circuitry, including block 519. For this purpose, one must detect the case when the same address is accessed in consecutive cycles. In SRAM design with a hierarchical bit line structure, READ data is available at a global bit line (GBL) level after one cycle, so the skilled artisan, with the teachings herein at his or her disposal, will appreciate that one can put the WRITE-back (WB) block in the GBL level. This can be done without incurring a significant area penalty.

It will be appreciated that FIG. 6 depicts possible additions to the circuit of FIG. 5, including the bypass memory 560, wherein the control circuitry, including control block 519, is operatively coupled to the bypass memory (for example, via multiplexer 562) and further configured to cause the new data to be written to the bypass memory 560 in parallel with the reading in the first cycle. In one or more embodiments, data is always written to the bypass memory and the new data latch; this is to be understood throughout the specification and claims to be encompassed within the language of the preceding sentence (that is, the control block detects where to read from but does not change from case-to-case where data is written to; "causation" by the control circuitry should be broadly understood in this sense). The control circuitry can be yet further configured to detect a condition wherein at least one of the cells is to undergo the WRITE operation followed immediately by a READ operation during the immediately subsequent second cycle, and, responsive to detecting the condition, cause the new data associated with the at least one of the cells to be read from the bypass memory 560, instead of any of the cells in the given one of the rows, during the READ operation following the WRITE operation. Preferably, the control circuitry is further configured to cause the new data to be read from the entire bypass memory 560, instead of any of the cells in the given one of the rows. This is the usual and simplest approach, but, of course, other approaches are possible—for example, one could read only the portions of the bypass memory associated with the cells having the data hazard. In one or more embodiments, only a single multiplexer 562 and bypass memory 560 are employed per circuit.

WRITE-after-WRITE Data Hazard

Figure 7:
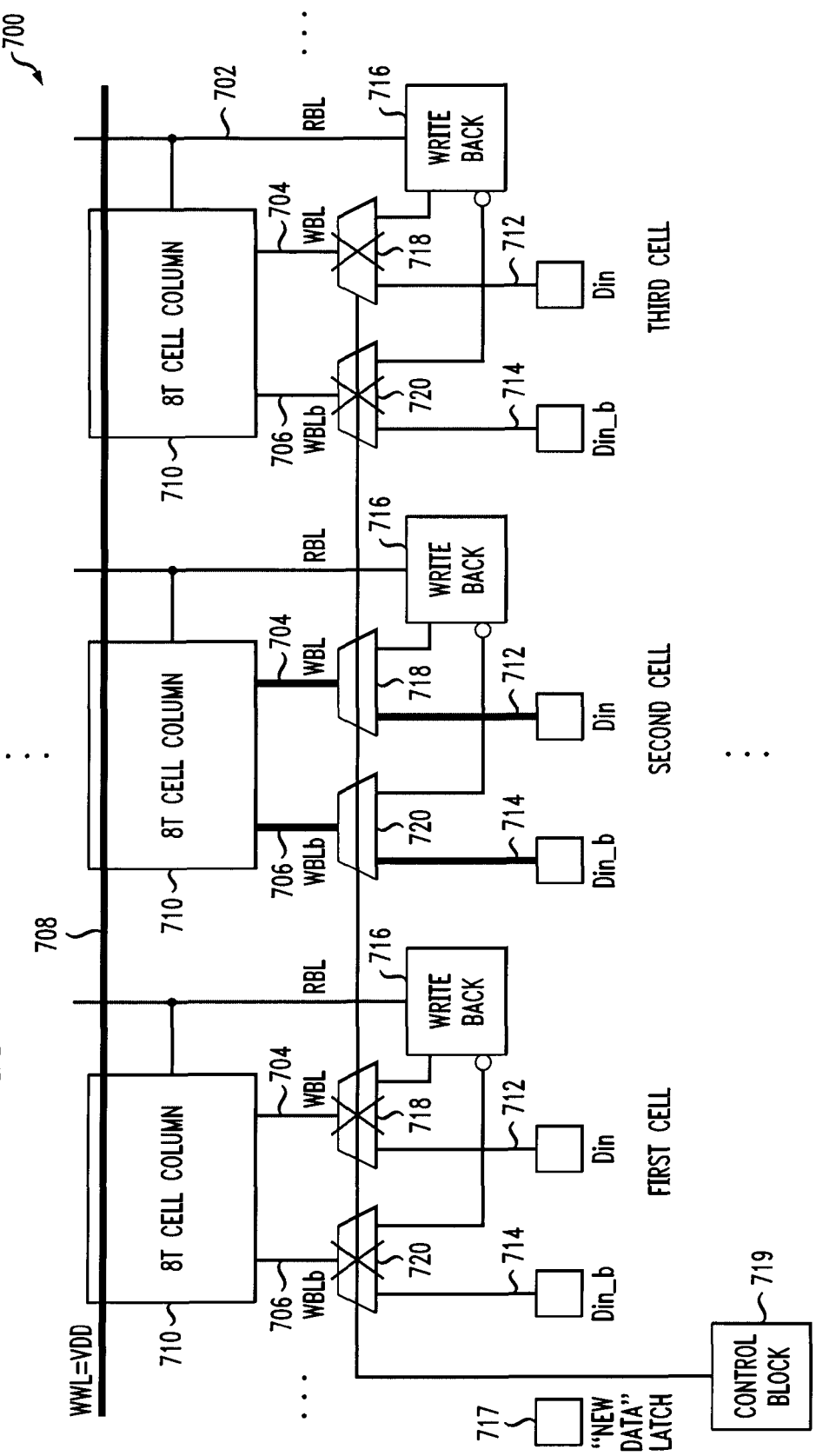
Figure 8:
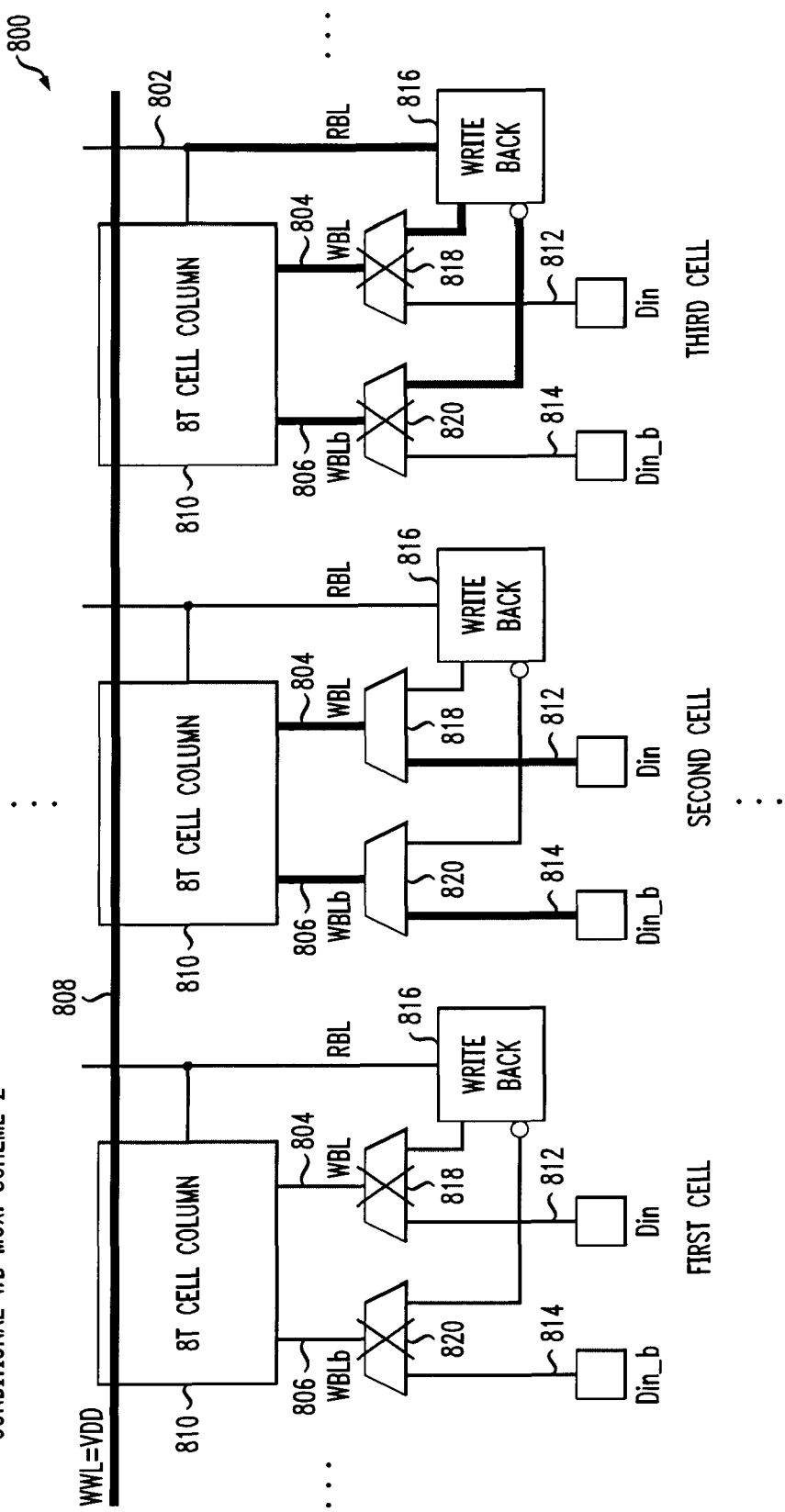

If a back-to-back WRITE-WRITE occurs for different cells along the same word line, false data may be written back to cells which were supposed to be written in the first WRITE period. Let us call the cells "Cell-W1". In other words, when the second cycle WRITE is performed, data from the Cell-W1 is read for WRITE-back but the read data may not be valid since WRITE to the cell has not been finished in the cycle. To prevent this hazard, an inventive conditional WRITE-BACK scheme may be implemented. The circuit of FIG. 5 is reproduced in FIGS. 7 and 8 (with another illustrative cell added) for purposes of discussing issues associated with the subject data hazard. FIG. 7 depicts a first approach, and items therein similar to those in FIG. 5 have received the same reference character incremented by two hundred. FIG. 8 depicts a second approach, and items therein similar to those in FIG. 5 have received the same reference character incremented by three hundred. Note that only one new data latch 717 is shown in FIG. 7, for purposes of illustrative convenience, but as discussed with regard to FIG. 5, one such latch should be provided for each column. Similarly, no new data latch at all is depicted in FIG. 8, again, purely for illustrative convenience.

Conditional WRITE-BACK Scheme

A block (to be discussed further below) is included in the control circuitry (for example, within block 519, 719 thereof). This block generates a control signal when it detects that the same WRITE word line address is accessed in consecutive cycles. The block is not shown in FIG. 8 but it will be appreciated that it is present in circuit 800 as well. In both the schemes of FIGS. 7 and 8, cells along the same WRITE word line 708, 808 are categorized as follows. A cell which was written in the previous cycle is referred to as a "first" cell; a cell being written in the current cycle is referred to as a "second" cell, and a cell that is neither a first cell nor a second cell is referred to as a "third" cell. In the scheme of FIG. 7, the multiplexers 704, 706 pass the WRITE input Din, Din_b for the second cell, while the multiplexers 718, 720 for the first and third cells are disabled (as indicated by being "X-ed out"), so that both the WRITE input and the write back data 716 are blocked. The bit lines associated with the disabled multiplexers hold the data from the previous cycle. In this approach, the Cell-W1 can have the correct WRITE bit line voltage data since the WRITE bit line voltage is the same as data written in the previous cycle.

In the scheme of FIG. 8, the WRITE input is passed for the second cell as before, and both the WRITE input and the write back data 816 are blocked for the first cell. However, for the third cell, the write back data 816, previously read for the cell, is written back. In both schemes, control signals from the control circuitry effect the required disabling and selection in the multiplexers 718, 720 and 818, 820.

Thus, by way of summary, in the conditional WRITE-back scheme, the control circuitry is further configured to detect a condition where a given one of the WRITE word lines 508, 708, 808 is to be accessed during the second cycle and also in an immediately subsequent third cycle. The WRITE word line 508, 708, 808 has at least a first cell selected for writing in the second cycle and not the third cycle ("first cell" described above), and at least a second cell selected for writing in the third cycle ("second cell" described above). Responsive to detecting the condition, during the third consecutive cycle, WRITE data is passed to the second cell, via a given one of the WRITE bit lines associated with the second cell, and data from the second consecutive cycle is retained, on another given one of the WRITE bit lines associated with the first cell.

Still by way of summary and clarification, in general, the WRITE word line 510, 710, 810 has a plurality of the first cells selected for writing in the second cycle and not the third cycle, a plurality of the second cells selected for writing in the third cycle, and, as discussed, a plurality of third cells that do not qualify as first cells or second cells. In one approach (FIG. 7), the control circuitry is further configured to pass the WRITE data only to the second cells, while in another approach, the control circuitry is further configured to pass the WRITE data to the second cells and WRITE-BACK data, from the retained data latch 516, to the third cells (FIG. 8).

FIGS. 9 and 10 show exemplary implementations of WRITE/WRITE-back multiplexers, suitable for implementing the just-discussed conditional WRITE-back scheme. In particular, FIG. 9 shows a multiplexer 900 that can implement the multiplexers 718, 720 of FIG. 7, while FIG. 10 shows a multiplexer 1000 that can implement the multiplexers 818, 820 of FIG. 8. It will be appreciated that FIGS. 9-12 show a single column's worth of circuitry, and that the circuitry therein can be repeated for each column (although, for example, a single control block can typically be employed). WRITE data input 902 and WRITE-back data input 904 are provided, and the appropriate one is selected for interconnection with the WRITE bit line 906, under action of the control circuitry. The multiplexer can be implemented, for example, as shown on the right-hand side of FIG. 9. A first complementary pair of FETs, including NFET 908 and PFET 910, have first drain-source terminals coupled together to interconnect with the WRITE data line 902, and second drain-source terminals coupled together to interconnect with WRITE bit line 906. Similarly, a second complementary pair of FETs, including NFET 912 and PFET 914, have first drain-source terminals coupled together to interconnect with the WRITE-back data line 904, and second drain-source terminals coupled together to interconnect with WRITE bit line 906. The gates of the FETs 908, 910, 912, 914 are numbered respectively as 916, 918, 920, 922, and receive, respectively, true and complementary select WRITE signals S_WR and S_WR_b, and true and complementary select WRITE-back signals S_WB and S_WB_b. The select WRITE and select WRITE-back signals can be generated, for example, from the CS and CONSEC signals using the equations in the figure; the CS and CONSEC signals can in turn be generated, for example, as discussed below with regard to FIG. 16.

Items in FIG. 10 similar to FIG. 9 have received the same reference character incremented by one hundred and will not be described again. The difference is in the generation of the control signals, as shown.

Figure 11:
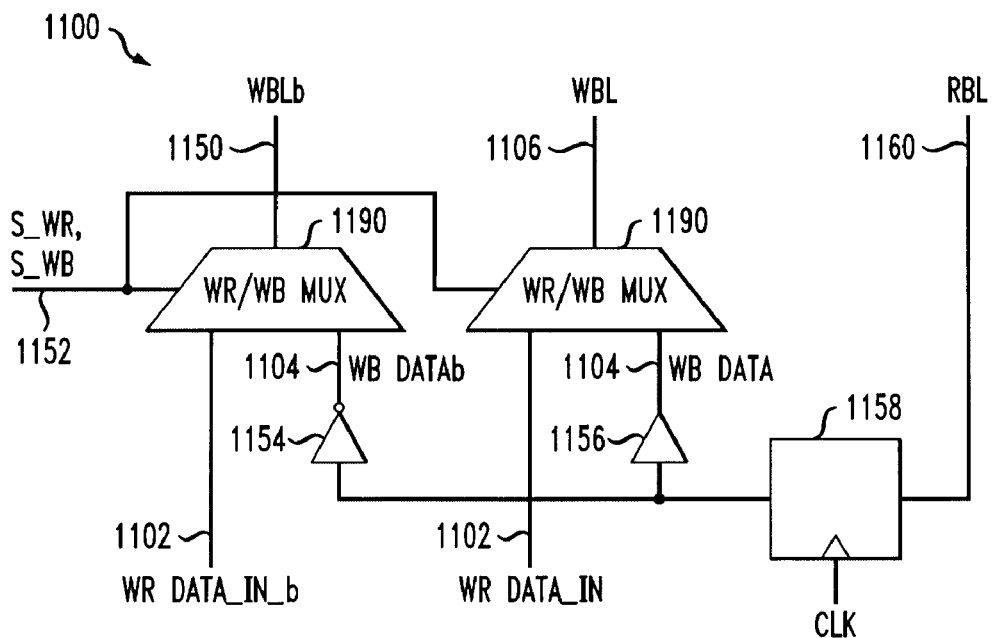

FIG. 11 shows an exemplary WRITE/WRITE-back selection block diagram 1100. Two multiplexers 1190 are employed (for example, of the kind described in the preceding figures). Each has the S_WR, S_WB control signals 1152 as a control. Each has a WRITE data input 1102 and a WRITE-back data input 1104. The left-hand multiplexer 1190 receives complementary WRITE data at the port 1102 and complementary WRITE-back data from latch 1158 (inverted in inverter 1154), with output to complementary WRITE bit line 1150. The right-hand multiplexer 1190 receives true WRITE data at the port 1102 and true WRITE-back data from latch 1158 having a clock input and interconnection with READ bit line 1160, through non-inverting buffer 1156, with output to true WRITE bit line 1106. Latch 1158 is connected to READ bit line 1160 to obtain the data read during the READ part of the two-step WRITE process. Buffer 1156 is not needed logically but is illustrated for comparison with inverting buffer 1154.

Figure 12:
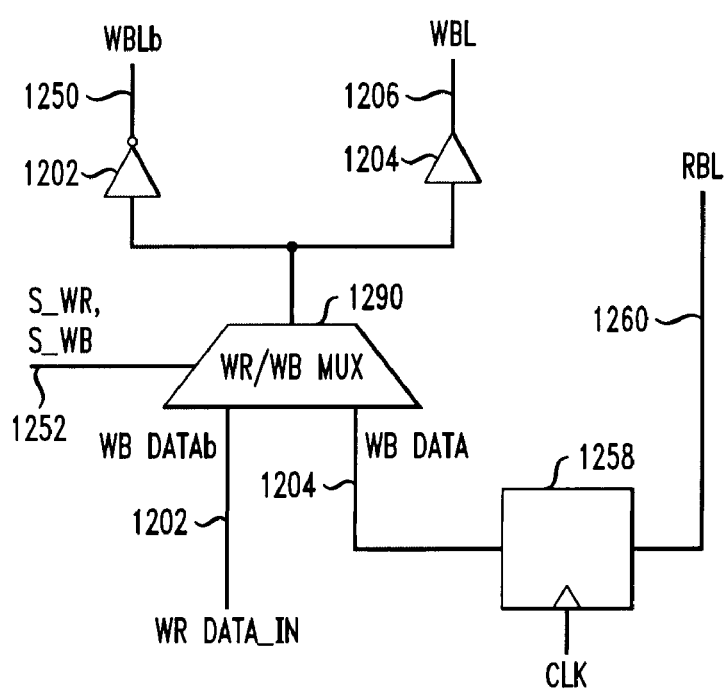

FIG. 12 shows an alternative exemplary WRITE/WRITE-back selection block diagram 1200. One multiplexer 1290 (for example, of the kind described in the preceding figures) is employed, having the S_WR, S_WB control signals 1252 as a control, with WRITE data input 1202 and WRITE-back data input 1204. Multiplexer 1290 receives true WRITE data at the port 1202 and true WRITE-back data at port 1204 from latch 1258 having a clock input and interconnection with READ bit line 1260. The output of multiplexer 1290 is passed through inverter 1202 to complementary WRITE bit line 1250 and through non-inverting buffer 1204 to true WRITE bit line 1206. It should be understood that the control signals for the multiplexers in FIGS. 11 and 12 can be generated by the control block (omitted from FIGS. 9 and 10 for purposes of illustrative convenience); further, the input WRITE data can be latched in a latch such as latch 517 (also omitted from FIGS. 9 and 10 for purposes of illustrative convenience).

Conditional Multiple Write-Back Scheme

An exemplary variation of the above-mentioned conditional WRITE-BACK scheme will now be discussed; it is referred to as the Conditional Multiple WRITE-BACK scheme. In the Conditional WRITE-BACK scheme, the WRITE-data needs to be held in the new data latch for one cycle to allow for the Read-Modify-Write mechanism.

Figure 13:
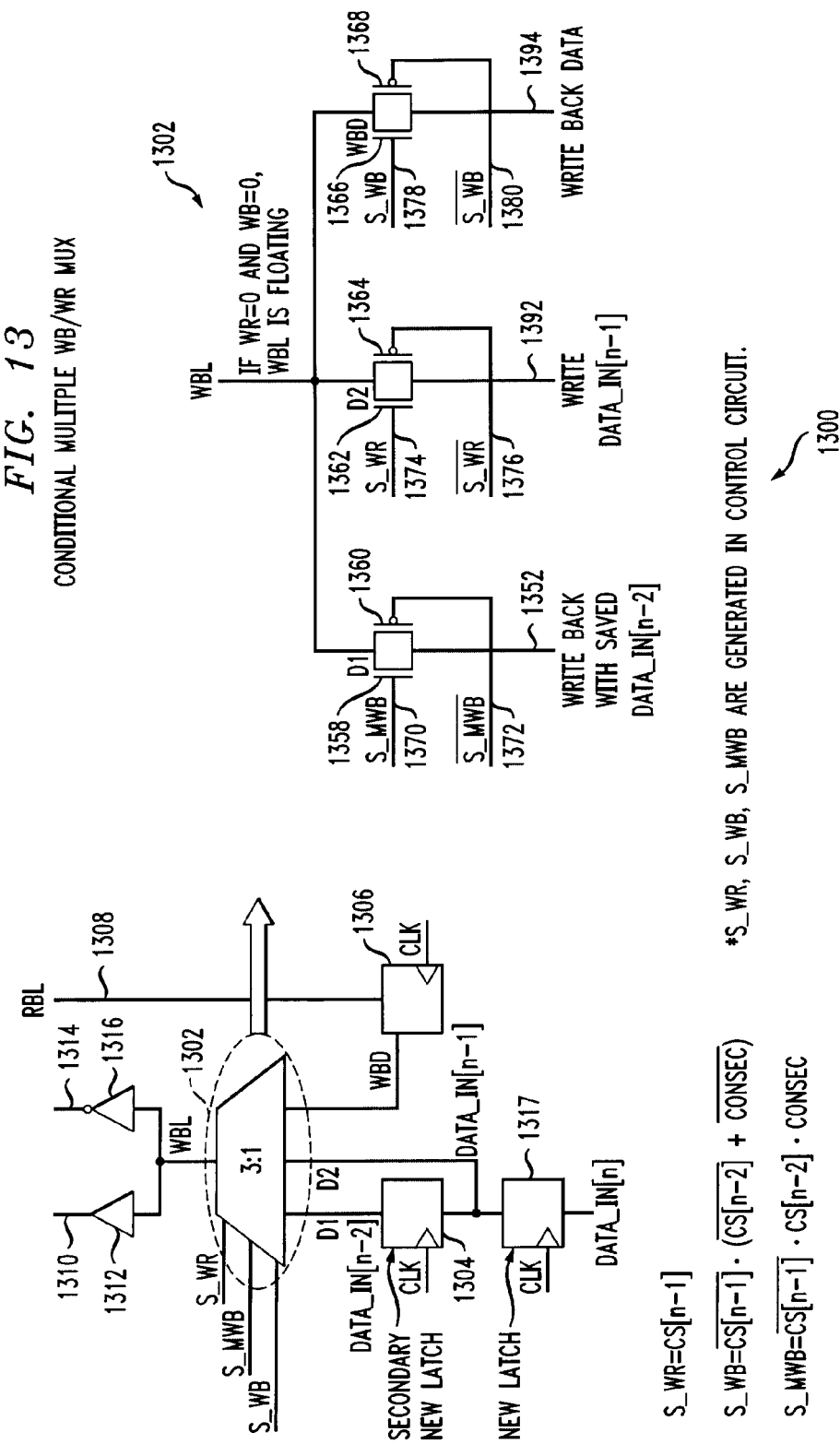
FIG. 13 shows exemplary circuitry for handling a WRITE-after-WRITE data hazard, via a conditional multiple WRITE-back scheme, according to an aspect of the invention.

The Conditional Multiple WRITE-back scheme can be implemented, for example, by adding one or more components to the circuits depicted in FIGS. 5, 7 and 8, as well as enhancing the functionality of the control circuitry, including blocks 519, 719. With reference now to FIG. 13, in one exemplary approach, circuitry 1300 includes a conditional multiple WRITE-back multiplexer 1302. It will be appreciated that FIG. 13 shows a single column's worth of circuitry, and that the circuitry therein can be repeated for each column (operatively coupled, for example, to a single control block). A secondary latch for new data (also referred to herein as a secondary new data latch) 1304 is provided and is operatively coupled (in the sense that the control block tells the multiplexer which signal to take) to the control block (such as 519) (omitted from FIG. 13 for purposes of illustrative convenience), and receives the clock input. Retained data latch 1306 also receives the clock input, and is coupled to READ bit line 1308 to receive the data read in the first (READ) part of the WRITE operation. The inputs to multiplexer 1302 thus include the WRITE data in (WR data_in), provided directly (after one cycle delay in new data latch 1317) at port D2, the delayed WRITE data, delayed in secondary new data latch 1304, at port D1, and the WRITE-back data from latch 1306 at port WBD. Control signals S_WR, S_WB, and S_MWB are provided by a control block such as 519. The WRITE bit line signal WBL is the output of the multiplexer. The output of the multiplexer 1302 is provided to the true WRITE bit line 1310 through non-inverting delay stage 1312 and to complementary WRITE bit line 1314 through inverter 1316.

Control circuitry, including block 519, in this approach, is further configured to detect a condition where a given one of the WRITE word lines is to be accessed during the second cycle and also in an immediately subsequent third cycle, due to a second WRITE operation. That is, under normal conditions, a case where in the first cycle, the READ part of the first WRITE is executed, then in the second cycle, the WRITE part of the first WRITE and the READ part of the second WRITE are executed, and finally, in the third cycle, the WRITE part of the second WRITE is executed. The WRITE word line has at least a first cell selected for writing in the second cycle and not the third cycle, and at least a second cell selected for writing in the third cycle (same terminology as in FIGS. 7 and 8 above). Responsive to detecting the condition, during the second consecutive cycle, the control circuitry, including block 519, causes the following to occur: (i) writing of the new data from the new data latch 1317 to the secondary new data latch 1304, and (ii) storing, into the new data latch 1317, second cycle new data to delay the second WRITE operation for a cycle. Further, during the third consecutive cycle, the control circuitry causes the following to occur: (i) pass one-cycle delayed WRITE data, from the new data latch 1317, to the second cell, via a given one of the WRITE bit lines associated with the second cell, and (ii) pass two-cycle delayed WRITE data, from the secondary new data latch 1304, on another given one of the WRITE bit lines associated with the first cell (controlled via multiplexer 1302 coupled to block 517).

In general, the WRITE word line has a plurality of the first cells selected for writing in the second cycle and not the third cycle (left side of FIG. 7), a plurality of the second cells selected for writing in the third cycle (right side of FIG. 7), and a plurality of third cells (not shown) that do not qualify as first cells or second cells. In one approach, the control circuitry, including block 519, is further configured to pass the one-cycle delayed WRITE data only to the second cells, while in another approach, the control circuitry, including block 519, is further configured to cause, in the second cycle, data associated with all cells (in a given one of the rows that is to be written to) to be read into the retained data latch 1306, and the control circuitry is still further configured to cause, in the third cycle, the one-cycle delayed WRITE data to be passed the second cells, WRITE-BACK data, from the retained data latch 1306, to be passed to the third cells, and the two-cycle delayed WRITE data to be passed to the first cells.

The right-hand side of FIG. 13 shows one possible exemplary implementation of multiplexer 1302. A first complementary pair of FETs, including NFET 1358 and PFET 1360, have first drain-source terminals coupled together to interconnect with the D1 input line 1352, and second drain-source terminals coupled together to interconnect with WRITE bit line WBL. Similarly, a second complementary pair of FETs, including NFET 1362 and PFET 1364, have first drain-source terminals coupled together to interconnect with the D2 input line 1392, and second drain-source terminals coupled together to interconnect with WRITE bit line WBL. Yet further, a third complementary pair of FETs, including NFET 1366 and PFET 1368, have first drain-source terminals coupled together to interconnect with the write back data line 1394, and second drain-source terminals coupled together to interconnect with WRITE bit line WBL. The gates of the FETs 1358, 1360, 1362, 1364, 1366, 1368 are numbered respectively as 1370, 1372, 1374, 1376, 1378, and 1380, and receive, respectively, true and complementary S_MWB, true and complementary S_WR, and true and complementary S_WB. S_MWB, S_WB, and S_WR can be calculated (for example, by the control circuit) as shown by the equations in FIG. 13, with CS[n−1], CS[n−2], and CONSEC from the circuit of FIG. 16.

FIG. 14 shows a high level view of control block 519 (also applicable to control block 719 or a control block for use with other circuits, such as, for example, that of FIG. 8). Port 1402 is the address for the cell, ADDR, where ADDRrow=Address for Row, and ADDRcol=Address for column. Port 1404 is the WRITE enable, WR_EN, while port 1406 is the READ enable, RD_EN. Port 1408 is CS, the column select signal decoded from ADDRcol, while port 1410 is the "Read from bypass memory?" which has a value of 1 when we need to read from bypass memory. Port 1412 is S_WR (we pass the Write data when S_WR=1), port 1414 is S_WB (we pass the read data from the cell for write back when S_WB=1), and optional port 1416 is S_MWB (we pass the two-cycle delayed write data when S_MWB=1) for use with the conditional multiple write-back scheme.

FIG. 15 shows one possible manner in which circuitry such as control circuit 519 (or other control circuitry) can generate the "Read from bypass memory?" signal. The signal is given by the logical equation:

"Read from bypass memory?"=$WR\_EN[n-1] \cdot RD\_EN[n] \cdot (ADDR[n-1]=ADDR[n])$ Thus the bypass memory will be read when a WRITE is followed by a READ for the same cell. The signal can be generated by an AND gate 1502 having as a first input the output of AND gate 1504, which has as its inputs RD_EN[n] and WR_EN[n−1], the latter signal being generated by passing WR_EN[n] through flip flop 1506 (with the clock signal designated as CLK). The second input of gate 1502 is the output of bitwise comparator 1508, which has as its inputs ADDR[n] and ADDR[n−1], the latter signal being generated by passing ADDR[n] through flip flop 1510 (with the clock signal designated as CLK).

FIG. 16 shows one possible manner in which circuitry such as control circuit 519 (or other control circuitry) can generate the CS and CONSEC (consecutive access) signals. The column select signal CS is already available from ADDRcol using techniques from conventional SRAMs that will be apparent to the skilled artisan given the teachings herein. The CS[n−1] and CS[n−2] signals are available by passing CS[n] through first and second flip flops 1602, 1604, the clock signal again being referred to throughout FIG. 16 as CLK. The CONSEC signal is given by the logical formula:

$CONSEC=WR\_EN[n-2] \cdot (ADDRrow[n-2]=ADDRrow[n-1]))$.

The CONSEC signal can be generated by an AND gate 1606 having as a first input SAME_ADDRrow[n−2], generated by passing the SAME_ADDRrow[n−1] signal (available in FIG. 15) through flip flop 1608. The second input of gate 1606 can be WR_EN[n−2], generated by passing WR_EN[n] through flip flops 1610, 1612.

The invention also includes methods of writing data during a WRITE operation in a memory having a plurality of bit line structures including decoupled READ and WRITE bit lines, including method steps corresponding to the operations described in connection with FIGS. 3-13.

At least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the devices or circuits described herein, and may include other devices, structures or circuits. The individual die are cut or diced from the wafer, then packaged as an integrated circuit. A person of skill in the art will know how to dice wafers and package die to produce integrated circuits. Integrated circuits so manufactured are considered part of the present invention. Circuits including cells as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (for example, by providing a copy of the storage medium storing the design) or electronically (for example, through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A memory circuit comprising:
   a plurality of cells forming rows and columns;
   a retained data latch;
   a latch for new data; and
   control circuitry operatively coupled to said cells, said retained data latch, and said latch for new data, said control circuitry being configured to write data during a WRITE operation by:
   in a first cycle, read, into said retained data latch, data associated with all cells in a given one of said rows that is to be written to, and store, into said latch for new data, new data to delay said WRITE operation for a cycle; and
   in an immediately subsequent second cycle:
   write said read data from said retained data latch back to those of said cells that are in a half-select condition; and
   write said new data from said latch for new data to those of said cells that are in a full-select condition.

2. The circuit of claim 1, further comprising:
   a plurality of bit line structures including decoupled READ and WRITE bit lines; and
   a plurality of word line structures, including at least WRITE word lines, and intersecting said plurality of bit line structures at a plurality of cell locations;
   wherein said cells are located at said plurality of cell locations, said rows are associated with given ones of said word line structures, and said columns are associated with given ones of said bit line structures.

3. The circuit of claim 2, further comprising a bypass memory, wherein said control circuitry is operatively coupled to said bypass memory and further configured to:
   cause said new data to be written to said bypass memory in parallel with said reading in said first cycle;
   detect a condition wherein at least one of said cells is to undergo said WRITE operation followed immediately by a READ operation during said immediately subsequent second cycle; and
   responsive to detecting said condition, cause said new data associated with said at least one of said cells to be read from said bypass memory, instead of any of said cells in said given one of said rows, during said READ operation following said WRITE operation.

4. The circuit of claim 3, wherein said control circuitry is further configured to cause said new data to be read from said entire bypass memory, instead of any of said cells in said given one of said rows.

5. The circuit of claim 2, wherein said control circuitry is further configured to:
   detect a condition where a given one of said WRITE word lines is to be accessed during said second cycle and also in an immediately subsequent third cycle, said WRITE word line having at least a first cell selected for writing in said second cycle and not said third cycle, and at least a second cell selected for writing in said third cycle; and
   responsive to detecting said condition, during said third consecutive cycle:
   pass WRITE data to said second cell, via a given one of said WRITE bit lines associated with said second cell; and
   retain data from said second consecutive cycle on another given one of said WRITE bit lines associated with said first cell.

6. The circuit of claim 5, wherein said WRITE word line has a plurality of said first cells selected for writing in said second cycle and not said third cycle, a plurality of said second cells selected for writing in said third cycle, and a plurality of third cells that do not qualify as first cells or second cells, and wherein said control circuitry is further configured to pass said WRITE data only to said second cells.

7. The circuit of claim 5, wherein said WRITE word line has a plurality of said first cells selected for writing in said second cycle and not said third cycle, a plurality of said second cells selected for writing in said third cycle, and a plurality of third cells that do not qualify as first cells or second cells, and wherein said control circuitry is further configured to pass said WRITE data to said second cells and WRITE-BACK data, from said retained data latch, to said third cells.

8. The circuit of claim 2, further comprising a secondary latch for new data operatively coupled to said control circuitry, wherein said control circuitry is further configured to:

detect a condition where a given one of said WRITE word lines is to be accessed during said second cycle and also in an immediately subsequent third cycle, due to a second WRITE operation, said WRITE word line having at least a first cell selected for writing in said second cycle and not said third cycle, and at least a second cell selected for writing in said third cycle; and responsive to detecting said condition:

during said second consecutive cycle:

write said new data from said latch for new data to said secondary latch for new data; and store, into said latch for new data, second cycle new data to delay said second WRITE operation for a cycle; and during said third consecutive cycle:

pass one-cycle delayed WRITE data, from said latch for new data, to said second cell, via a given one of said WRITE bit lines associated with said second cell; and pass two-cycle delayed WRITE data, from said secondary latch for new data, on another given one of said WRITE bit lines associated with said first cell.

9. The circuit of claim 8, wherein said WRITE word line has a plurality of said first cells selected for writing in said second cycle and not said third cycle, a plurality of said second cells selected for writing in said third cycle, and a plurality of third cells that do not qualify as first cells or second cells, and wherein said control circuitry is further configured to pass said one-cycle delayed WRITE data only to said second cells.

10. The circuit of claim 8, wherein:

said WRITE word line has a plurality of said first cells selected for writing in said second cycle and not said third cycle, a plurality of said second cells selected for writing in said third cycle, and a plurality of third cells that do not qualify as first cells or second cells;

said control circuitry is further configured to cause, in said second cycle, data associated with all cells in a given one of said rows that is to be written to be read into said retained data latch; and said control circuitry is still further configured to cause, in said third cycle, said one-cycle delayed WRITE data to be passed said second cells and WRITE-BACK data, from said retained data latch, to be passed to said third cells.

11. The circuit of claim 2, wherein said bit lines structures, word line structures, and cells form a column-interleaved memory array under control of said control circuitry.

12. The circuit of claim 2, wherein:

said word line structures further comprise READ word lines;

said WRITE bit lines comprise true and complementary WRITE bit lines; and said cells each comprise:

a storage flip-flop;

first and second write access devices selectively coupling said storage flip flop to corresponding ones of said true and complementary WRITE bit lines under control of a corresponding one of said WRITE word lines; and a pair of series read access devices operatively interconnected with a corresponding one of said READ bit lines and said flip flop under control of a corresponding one of said READ word lines.

* * * * *